(12) United States Patent
Tsuda

(10) Patent No.: US 6,889,070 B2
(45) Date of Patent: May 3, 2005

(54) MAGNETIC RESONANCE IMAGING APPARATUS AND ASSEMBLY PROCESS THEREOF

(75) Inventor: Munetaka Tsuda, Mito (JP)

(73) Assignee: Hitachi Medical Corporation, Tokyo (JP)

( * ) Notice: Subject to any disclaimer, the term of this patent is extended or adjusted under 35 U.S.C. 154(b) by 226 days.

(21) Appl. No.: 09/987,337

(22) Filed: Nov. 14, 2001

(65) Prior Publication Data

US 2002/0087064 A1 Jul. 4, 2002

(30) Foreign Application Priority Data

Nov. 14, 2000 (JP) ........................................ 2000-346499

(51) Int. Cl.[7] .............................................. A61B 5/055
(52) U.S. Cl. ...................... 600/410; 324/318; 335/216; 335/296; 335/297; 335/301
(58) Field of Search ................................. 600/410, 407, 600/411; 324/318–320, 322; 335/216, 296–297, 301, 299; 29/607

(56) References Cited

U.S. PATENT DOCUMENTS

| | | | | |
|---|---|---|---|---|
| 5,357,958 A | * | 10/1994 | Kaufman | .................... 600/410 |
| 5,917,395 A | * | 6/1999 | Overweg | .................... 335/296 |
| 6,014,070 A | * | 1/2000 | Danby et al. | ................ 335/296 |
| 6,225,805 B1 | * | 5/2001 | Damadian et al. | ........... 324/318 |
| 6,437,672 B1 | * | 8/2002 | Takeshima et al. | .......... 335/216 |
| 2002/0123681 A1 | * | 9/2002 | Zuk et al. | .................... 600/410 |

* cited by examiner

*Primary Examiner*—Eleni Mantis Mercader
(74) *Attorney, Agent, or Firm*—Antonelli, Terry, Stout & Kraus, LLP

(57) ABSTRACT

Magnetic resonance imaging apparatus having a pair of a first magnet device and a second magnet device for generating a magnetostatic field, the pair of magnet devices being installed opposite each other across an examination space for accommodating an examinee; a gradient-field generating device; a high-frequency field generating device; and a yoke for combining the first and second magnetic devices to guide magnetic fluxes generated by the first and second magnetic devices to thereby form a closed magnetic circuit, wherein the yoke includes a first plate member fixed to a first magnet device, a second plate member fixed to a second magnet device and one or more support-post members interconnecting the first plate member and the second plate member, each of the first and second plate members and support-post members includes a plurality of segments formed in a predetermined shape.

23 Claims, 14 Drawing Sheets

MAGNETIC RESONANCE IMAGING APPARATUS AND ASSEMBLY PROCESS THEREOF

BACKGROUND OF THE INVENTION

The present invention relates to a magnetic resonance imaging apparatus (hereafter referred to as an MRI apparatus), and more particularly to a large-scale MRI apparatus having magnetostatic-field-generating magnets for generating strong fields and a magnetic shield for insulating the high fields.

The MRI apparatus to obtain tomographic images of a human body by using the nuclear magnetic resonance phenomenon are widely used in medical institutions. In an examination using the MRI apparatus, magnets are required which generate uniform field strength in a space, where an examined region of an examinee is placed, to produce images reflecting the internal structure of the examined region.

For the magnets of the MRI apparatus, permanent magnets, normal conducting magnets and superconducting magnets have been put into practical use. The superconducting magnets, which can achieve higher magnetostatic field strength, are finding wider applciations than permanent magnets and normal conducting magnets. With MRI apparatus using superconducting magnets capable of providing uniform and high magnetostatic field strength, it has become possible to obtain high-quality images also in examinations by various methods of high-speed photography.

As for types of magnet, long, cylindrical solenoid type magnets have been used. On the other hand, various kinds of the open type magnet devices, which are open at the lateral sides and the front side thereof, have been developed, to get rid of the examinee's feeling or fear of being confined in a narrow space when entering the space between the magnet devices, and also to make it possible to perform interventional operations under the MRI examination as means of monitoring in medical treatment or surgery. Also in the MRI apparatus having such an open type magnet devices, high field magnet devices using super-conducting magnets have been put into practical application to realize high-speed high-quality picture taking. The open type MRI apparatus is disclosed in JP-A-11-197132, JP-A-11-155831 and JP-A-10-179546, for example.

However, as high magnetostatic field strengths have been achieved in the examination space where an examinee is placed, a problem has arisen that the magnetic flux density around the magnet device increases. This problem is conspicuous in the open type MRI apparatus. The magnetic flux density outside the magnet is called leakage field strength and defined by a distance from the magnet center to a location where a flux density of 0.5 mT is measured, and this distance is normally desired to be equal to or less than the size of a room where the MRI apparatus (magnet device) is installed. However, in an open-type MRI apparatus, such as mentioned above, which has high field superconducting magnets of an examination magnetic field density of 0.7 to 1.0 T, this distance is as large as more than 10 m.

To minimize the leakage field to the outside of the examination room, a possible solution is to enclose the walls of the examination room, where the magnets are installed, by a ferromagnetic material. However, to confine the superconducting magnets' leakage field strength of 0.7 to 1.0T within the range of the examination room of an ordinary size (8~10 m for example), it is necessary to put up a magnetic shield of not less than 10 cm in thickness, which is not practical.

Another solution may be considered to reinforce the magnetic shield by combining the magnets with a magnetic circuit composed of a ferromagnetic material. However, when a ferromagnetic substance is located close to the superconducting coils, there is a possibility that the ferromagnetic substance directly affects the distribution of the flux density in the examination space, and disturbs the field uniformity. If the field uniformity is disturbed, it becomes impossible to perform those imaging methods that require field uniformity of higher mode. For example, in the fat signal suppression method, by using a difference in resonance frequency of about 3~4 ppm between a water signal and a fat signal, a high luminance signal generated by the fat tissue of the examined region of a human body is suppressed, but this method is not applicable if a higher mode on the z axis occurs as much as 30 ppm.

It is known that attempts to correct a non-uniform field of higher mode by using current shims or miniscule iron pieces are often turned out to be impractical because high current shims or a large number of iron pieces are required for this purpose. Therefore, in the design stage of the magnet devices used in the conventional MRI apparatus, the layout of superconducting coils is decided so as to prevent the occurrence of a non-uniform field of higher mode. However, if one tries to realize superconducting magnets just as designed in the form of open-type superconducting magnets using a large-scale magnetic circuit (iron yoke), there are problems, such as an increased complexity of the structure of the iron yoke, the extreme complexity of processing materials to make the yoke in a monolithic form, and increased waste of materials. Yet another problem is that with the magnet devices using a monolithic iron yoke, it becomes very difficult to mount, inspect and maintain the super-conducting coils.

The weight of the MRI apparatus on completion is often over 10 tons. In such a case, many workers and heavy machinery are required to transport the MRI apparatus to the site and install it. Particularly, in the case of MRI apparatus that generates a high magnetic field by superconducting magnets, because its gross weight is several tens of tons, it should preferably be designed by taking the ease of transport and installation at the site into consideration. At the same time, it is required that the MRI apparatus is so structured as to keep a uniform field throughout the examination space.

SUMMARY OF THE INVENTION

An object of the present invention is to provide an MRI apparatus having a high magnetic field magnet, as well as an assembly method of the same, which is capable of efficiently confining a leakage magnetic field within a space in the room where the apparatus is installed, particularly with an open type MRI apparatus. Another object of the present invention is to provide an open type strong magnetic field MRI apparatus, as well as an assembly method of the same, which is capable of maintaining a high uniformity of magnetic field in an examination space and which makes it possible to apply examination methods, such as a fat signal suppression method. Yet another object of the present invention is to provide MRI apparatus, as well as an assembly method of the same, which makes it easy to assemble, inspect and maintain the superconducting coils.

According to an aspect of the present invention, a magnetic resonance imaging apparatus (hereafter referred to as MRI apparatus) comprises a pair of a first magnet device and a second magnet device for generating a magnetostatic field, the pair of magnet devices being installed in face-to-face relation with each other across an examination space for accommodating an examinee; a gradient-field generating system, a high-frequency (RF) field generating system; and a yoke for combining the first and second magnetic devices to guide magnetic fluxes generated by the first and second magnetic devices to thereby form a closed magnetic circuit, wherein the yoke includes a first plate member fixed to a first magnet device, a second plate member fixed to a second magnet device and one or more support-post members inter-connecting the first plate member and the second plate member, each of the first, second and support-post members includes a plurality of segments formed in such a shape as to minimize the leakage field strength from the first magnet device and the second magnet device.

According to an embodiment of the MRI apparatus of the present invention, the yoke may include a plurality of segments which have different shapes, and those segments of different shapes may be combined in such a pattern as to match the magnetic induction lines of the fluxes generated by the magnetostatic field generating magnets.

According to an aspect of the MRI apparatus of the present invention, the yoke of the magnetic circuit is formed by a combination of a plurality of segments as subdivisions thereof, the segments of different sizes can be easily manufactured by an ordinary cutting process or a machining process of standardized steel plate product available on the market, and easily transferred by a simple carriage to the installation site of the MRI apparatus, and assembled to build the MRI apparatus there. If the yoke is composed of small segments and the respective segments are formed in appropriately selected shapes, a yoke of an optimum shape can be obtained which is suitable for the flux distribution in the yoke and which minimizes the leakage magnetic field. It is not practical to try to obtain a yoke of such an optimum shape that matches the flux distribution by cutting or by any other machining process from a steel material of large bulk.

According to further aspect of the MRI apparatus of the present invention, a method of assembling the MRI apparatus is carried out as follows. In a desired place, a plurality of segments of the first plate member are stacked by fixing one after another, and those segments are connected together to thereby assemble the first plate member. Then, a plurality of segments of the support-post members are fixed one after another to the first plate member, and the support-post segments are connected to thereby assemble the support-post members. After this, a magnet device assembly is provided which connects the first magnet device and the second magnet device together by a connection pipe, the first and second magnet devices being arranged in face-to-face relation with each other across a predetermined space. The magnet device assembly is fixed to the first plate member and also to the support-post member in such a way that the first magnet device is located on the first plate member. Then, a plurality of segments of the second plate member are fixed one after another on the second magnet device, and thus the second plate member is assembled.

According to an aspect of assembling the MRI apparatus of the present invention, the MRI apparatus may be configured such that the magnet devices are to be mounted in the course of assembly of the magnetic shield, in which case, the magnet devices can be assembled, inspected and maintained merely by dismounting at least a part of the yoke.

DESCRIPTION OF THE EMBODIMENTS

Preferred embodiments of the present invention will be described with reference to the accompanying drawings.

Figure 1:
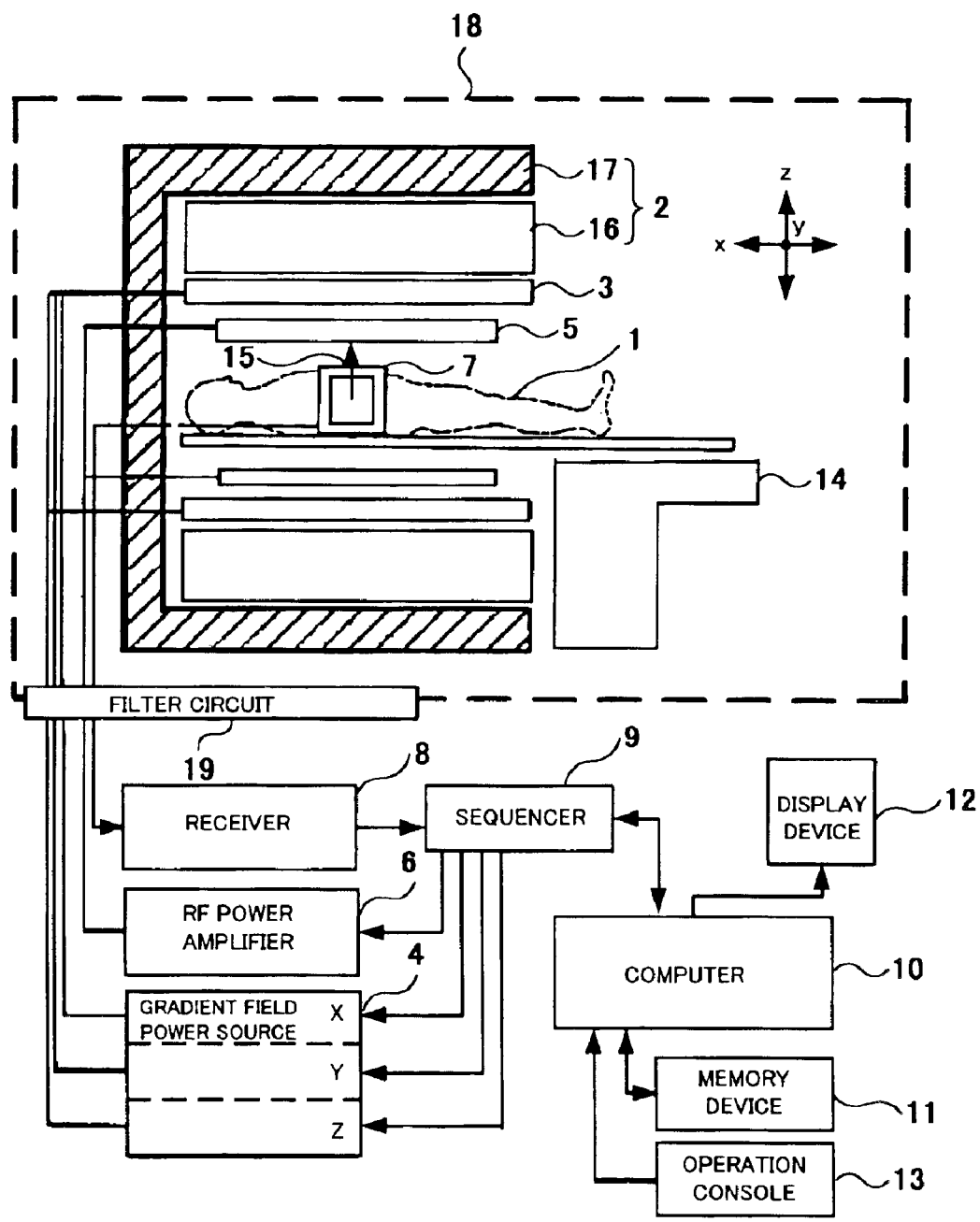
FIG. 1 is a diagram showing a general configuration of the MRI apparatus to which the present invention is applied.

FIG. 1 shows the general configuration of the MRI apparatus to which the present invention is applied. The MRI apparatus comprises a magnetostatic field generating magnets 2 arranged to have therebetween a space (examination space) where an examinee 1 is placed; gradient coils 3 arranged both inside the magnetostatic field generating magnets 2; RF coils arranged inside the gradient field coils 3, and a detection coil 7. The gradient field coils 3 each are shaped in a plate so as not to be in the way of the open type structure of the apparatus, and are fixed respectively to the magnetostatic field generating magnets 2. The MRI apparatus further comprises a sequencer 9 for controlling the operation timing of the coils; a computer 10 for processing NMR signals to produce images as well as controlling the apparatus; and a table 14 for placing the examinee 1 in the center space between the magnetostatic field generating magnets 2.

The pair of mangetostatic field generating magnets 2 is formed by two, upper and lower super-conducting magnets 16 in the embodiment of the present invention shown in FIG. 1. Those magnets 2 generate a magnetostatic field around the examinee 1 in a direction at right angles with the body axis. The field strength is high at 1.0T, for example, and the fluxes are directed from the floor toward the ceiling as indicated by an arrow mark 15. The field uniformity is adjusted so as to be not more than about 5 ppm in a 40 cm-diameter spherical space where the examinee 1 is placed by a passive shimming method of attaching a plurality of small pieces of magnetic material (not shown) to the surfaces of the superconducting magnets 16. An iron yoke 17 is provided as if to surround the upper and lower superconducting magnets 16. The iron yoke 17 is composed of a plurality of segments as described later, which are assembled in a structure capable of efficiently reducing the density of magnetic fluxes leaking to the outside of the magnets.

The gradient field coils 3 are each formed by three pairs of coils so wound as to vary the field density in three, x, y and z axes, which are perpendicular to one another, and those coils are connected to gradient field power sources 4. The gradient field coils 3 vary current values flowing therethrough as the gradient field power sources 4 are driven by control signals from the sequencer 9 to thereby apply gradient fields Gx, Gy abnd and Gz in the three axes to the examinee 1.

The RF coil 5 is connected to the other RF coil 5 and an RF power amplifier for supplying an RF current, and the RF coils 5 generate high-frequency magnetic fields to cause atomic nuclei (normally, hydrogen atomic nuclei) to resonate and excite at the examined region of an examinee (patient) 1. The RF power amplifier 6 is also controlled by control signals from the sequencer 9.

The computer 10 performs image reconstruction, spectrum calculation, etc. from NMR signals in digital form, and also controls the operation of the component units of the MRI apparatus at specified timing by signals from the sequencer 9. The computer 10 is connected to a memory device 11, a display device 12, and an operation console 13.

The MRI apparatus, having the gradient field coils 3, RF coils 5, a detection coil 7 and a table 14 mounted inside the magnetostatic field generating magnets 2, is installed in a radio-wave shielded room (examination room) 18 to prevent external electromagnetic-wave noise from getting into the detection coil 7. The coils within the examination room 18 are connected through a filter circuit 19 to the units (the power source 4, the power amplifier 6, and the receiver 8) outside the room.

Figure 2:
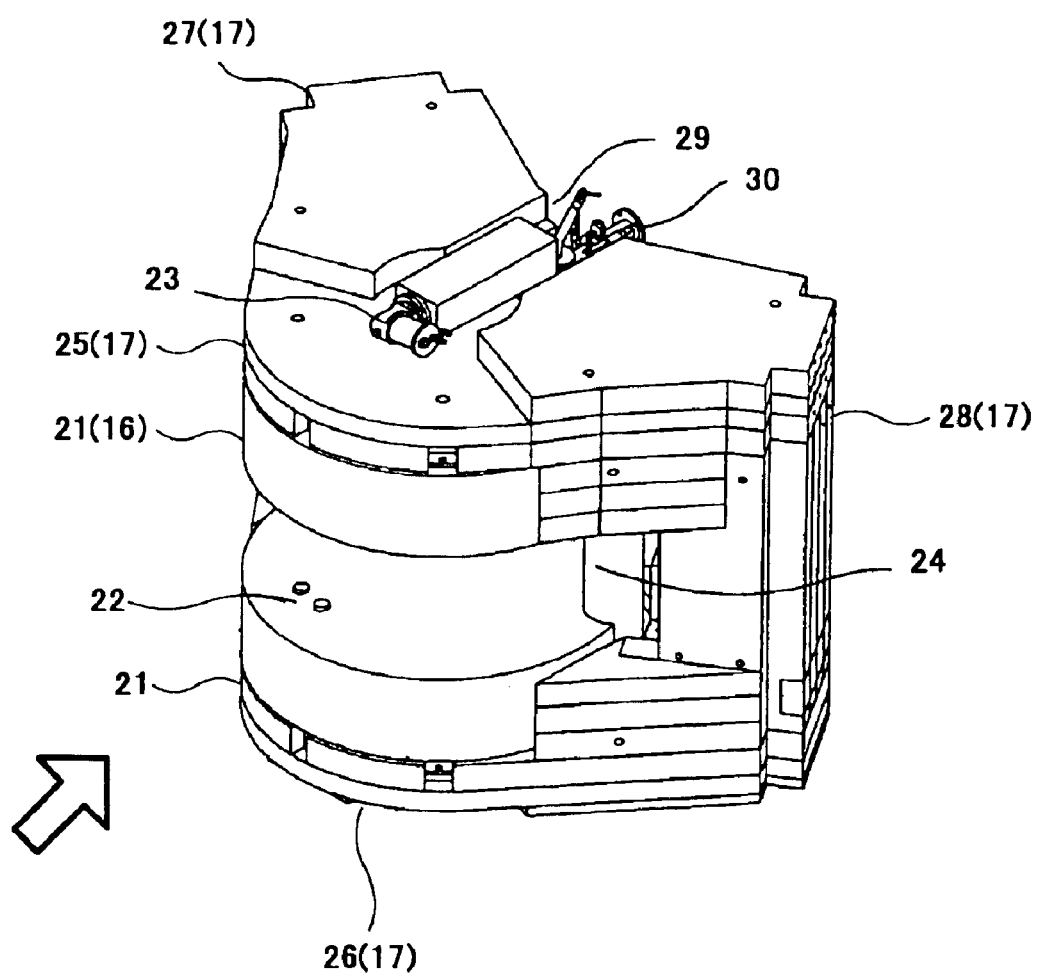
FIG. 2 is an external view of magnetostatic field generating magnets to which the present invention is applied.
Figure 3:
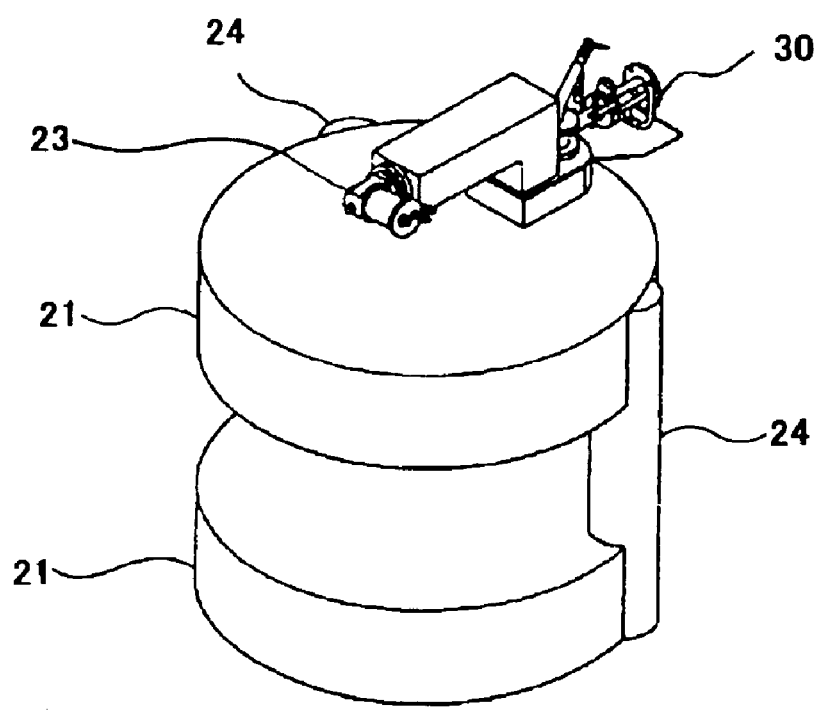
FIG. 3 is a diagram showing a basic component part of the magnetostatic field generating magnet.

The magnetostatic field generating magnets 2 will be described in greater detail. FIG. 2 is a general perspective view of the magnetostatic field generating magnets 2 and FIG. 3 is a general perspective view of the superconducting magnets 16.

The magnetostatic field generating magnets 2 are each composed of a superconducting magnet 16 and the yoke 17 as described above. As shown in FIG. 3, the superconducting magnets 16 include a pair of cryostats 21 incorporating a plurality of super-conducting coil rings (not shown), and a pair of left and right connection pipes 24 inter-connecting the upper and lower cryostats.

The upper cryostat 21 has mounted thereon a cryo-cooler 23 which suppresses the evaporation of liquefied helium filled in the cryostat 21. Each of the connection pipes 24 includes superconductor lines inter-connecting the superconducting coils in the upper and lower cryostats 21, a pipe for making even the amounts of liquefied helium in the upper and lower cryostats 21, and a heat-shielding plate for transferring the heat of cooling of the cryo-cooler. On the opposite end of the cryo-cooler 23, there is provided a service port for inspection and maintenance of the superconducting magnets, a helium inlet 30, for example, used to keep the cryostats 21 at cryotemperatures.

On the surface of the cryostats 21, there are attached miniscule iron pieces 22 as a passive shimming means to achieve desired magnetic field uniformity in the examination space. More specifically, the magnetic field uniformity is corrected so that the field is uniform at 5 ppm in a 40 cm-diameter spherical space.

The iron yoke 17 forms a magnetic circuit to reduce the leakage fluxes of such a superconducting magnet 16 as mentioned above. As main components, the iron yoke 17 includes an upper plate member 25, a lower plate member 26, and a left and a right support-post members 27, 28 inter-connecting the upper and lower plate members 25, 26.

The upper and lower cryostats 21, 21 are fixed to the side portions of the upper and lower plate members 25, 26 which are in face-to-face relation with each other. The upper plate member 25, the lower plate member 26, and the left and right support-post members 27, 28 are each composed of a plurality of iron plates. The upper-plate member 25, the lower-plate member 26, and the left support-post member 27 and the right support-post member 28 made of iron strips constitute a structure having a rectangular opening if the structure is viewed from the direction of the arrow mark indicated in FIG. 2. The magnetic fluxes generated by the superconducting magnets 16 in FIG. 3 form a closed magnetic circuit running through this rectangular structure.

The cross-sectional areas of the upper plate member 25, the lower plate member 26, the left support-post member 27, and the right support-post member 28, which jointly constitute the magnetic circuit, are respectively designed to be minimum areas such as not to be saturated by magnetic flux density. By selecting the cross-sectional areas, the magnets can be made by minimum masses so that the magnetic flux leaking to the outside can be reduced to a minimum. More specifically, the mass of the magnetic circuit is reduced without increasing the leakage flux by forming the magnetic circuit in such a way that its high-flux-density portion where the upper plate member 25 and the lower plate member 26 are connected to the support-post member is made thick and the center portion 29 with a low flux density is made thinner than both end portions. By making use a recess at the thin-thickness center portion 29 of the upper plate member 25, the cryo-cooler 23 and the liquefied helium inlet 30 are mounted. As a result, the overall height of the apparatus is made relatively low at 2.6 m for example.

As the air-core superconducting magnets and the iron yoke are combined to form the closed magnetic circuit, the superconducting coils are drawn to the iron yoke by the magnetic fluxes generated by the superconducting coils. The resulting effect is that the field uniformity decreases in the space where the examinee is located. To confine the expanse of leakage fields in a as-small-as-possible space by combining the iron yoke with the superconducting magnets conflicts with to increase the field density.

Figure 13:
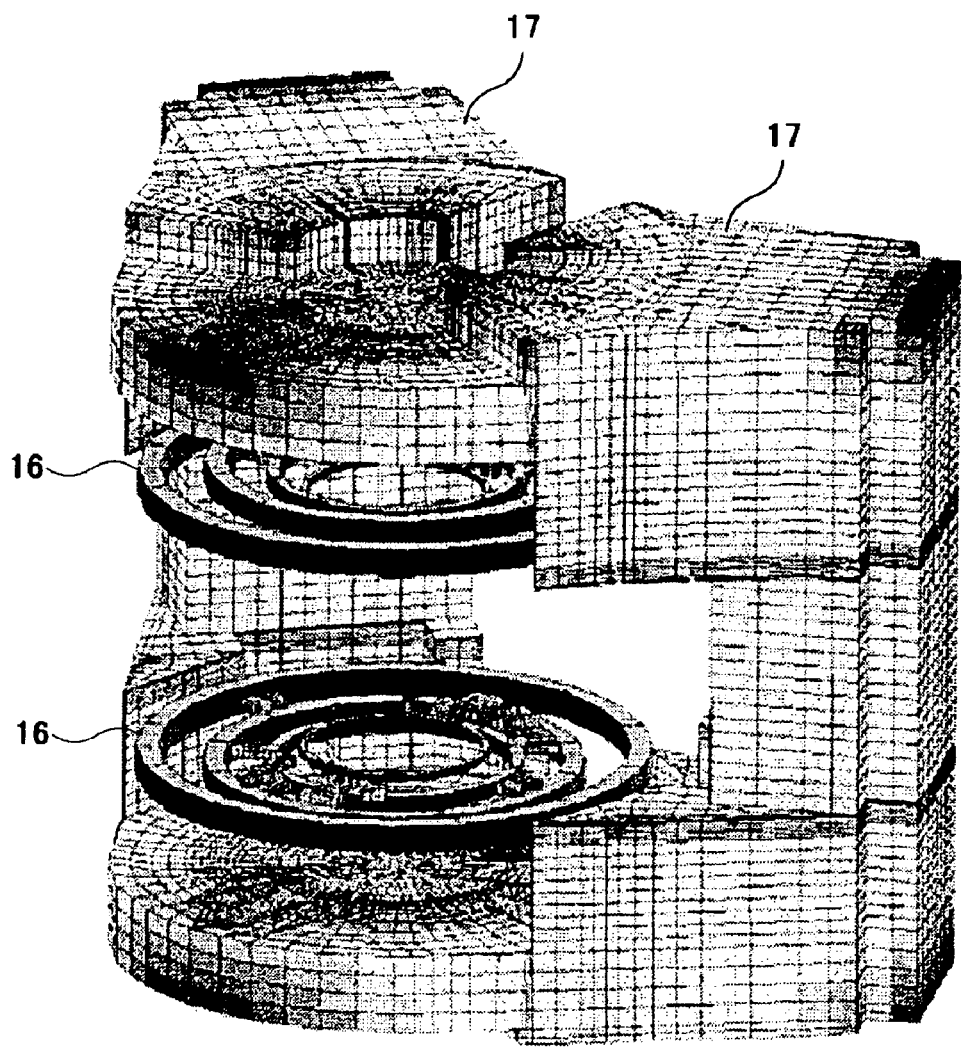
FIG. 13 is a wire diagram for consideration of magnetic flux distribution in the design process of the yoke of the MRI apparatus of the present invention.

In the present invention, the yoke is composed of a plurality of segments, and the shapes of the segments of the yoke are selected so that the yoke minimizes the leakage fluxes of the superconducting magnets and also minimizes the effect of the electro-magnetic force between the super-conducting coils and the iron yoke. In the present invention, as shown in FIG. 13, in the design stage, the magnetic flux distribution in the yoke 17 is calculated and the shape of the yoke is decided so as to match the magnetic flux density and so that the leakage fluxes of the super-conducting magnets are reduced to a minimum. In other words, the shapes of the segments of the yoke 17 are decided so that the field uniformity of the space in which the examinee 1 is placed is the best while limiting the expanse of leakage fluxes.

Figure 14:
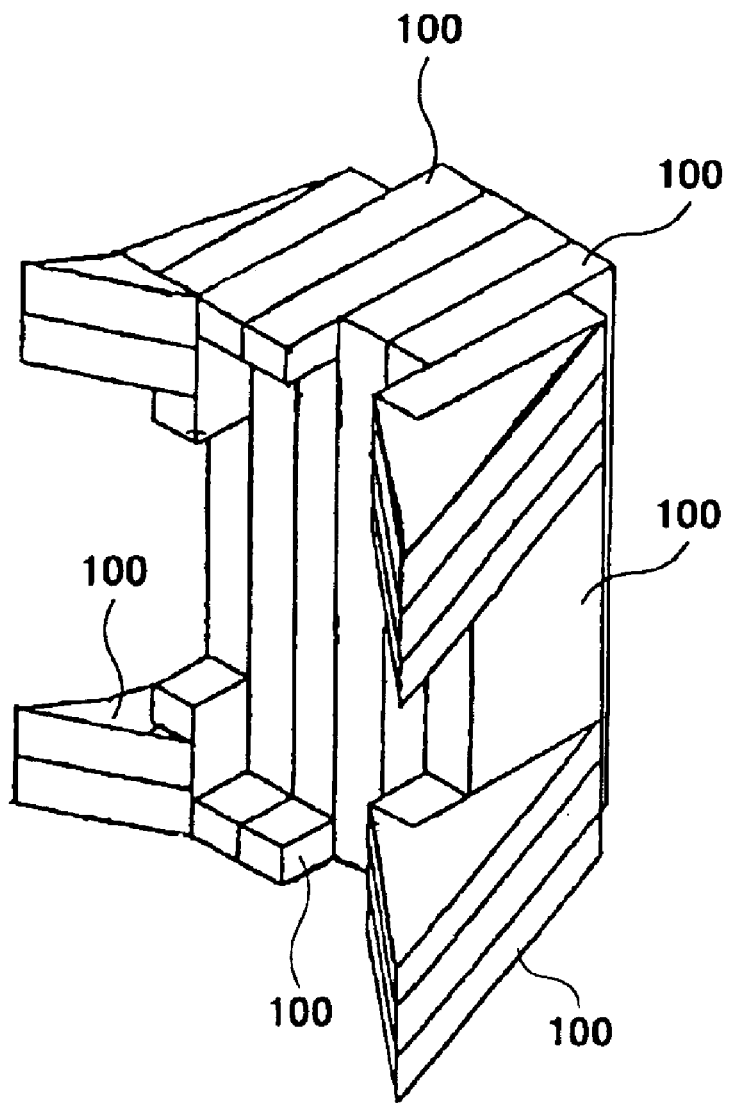
FIG. 14 shows how to put together the segments of a support-post of the yoke suitable for the magnetic flux distribution obtained according to the wire diagram in FIG. 13.

FIG. 14 shows the shape of the right support-post portion of the yoke 17, decided as described. The support-post portion shown in FIG. 14 is constructed by a combination of a plurality of segments 100 cut out of standardized steel plate of a specified thickness, for example, until it takes a shape decided as shown in FIG. 13. Note that the complicated shape consisting of ups and downs on the internal surfaces of the iron yoke. If one tries to manufacture the whole of the yoke shaped as shown in FIG. 13 from an iron block by machining, he has to go through a process which is highly complicated and time-consuming, and on top of that, the weight of the entire yoke 17 is very heavy, so that it is difficult to transport and the whole job is impractical. Therefore, it will be better to cut standardized iron plate of specified thickness into segments of shapes at one's discretion. According to this method of combining a number of segments, it is easy to form an up and down structure within the yoke, which is difficult to obtain by machining from outside.

In this structure, if each member is composed of a single piece of material, it weighs not less than about ten tons and therefore it is difficult to machine such a large block of material into a desired shape. In the MRI apparatus according to the present invention, however, because each member of the iron yoke is composed of a plurality of segments made of iron plate as described above, the machining and assembling processes are made easy. Above all else, it is easy to mount the upper and lower cryostats 21 and the connection pipes 24, which will be described later.

Referring to FIGS. 4–10, description will next be made of the procedure by which the magnetostatic field generating magnets 2 are carried into the examination room and assembled.

Figure 4:
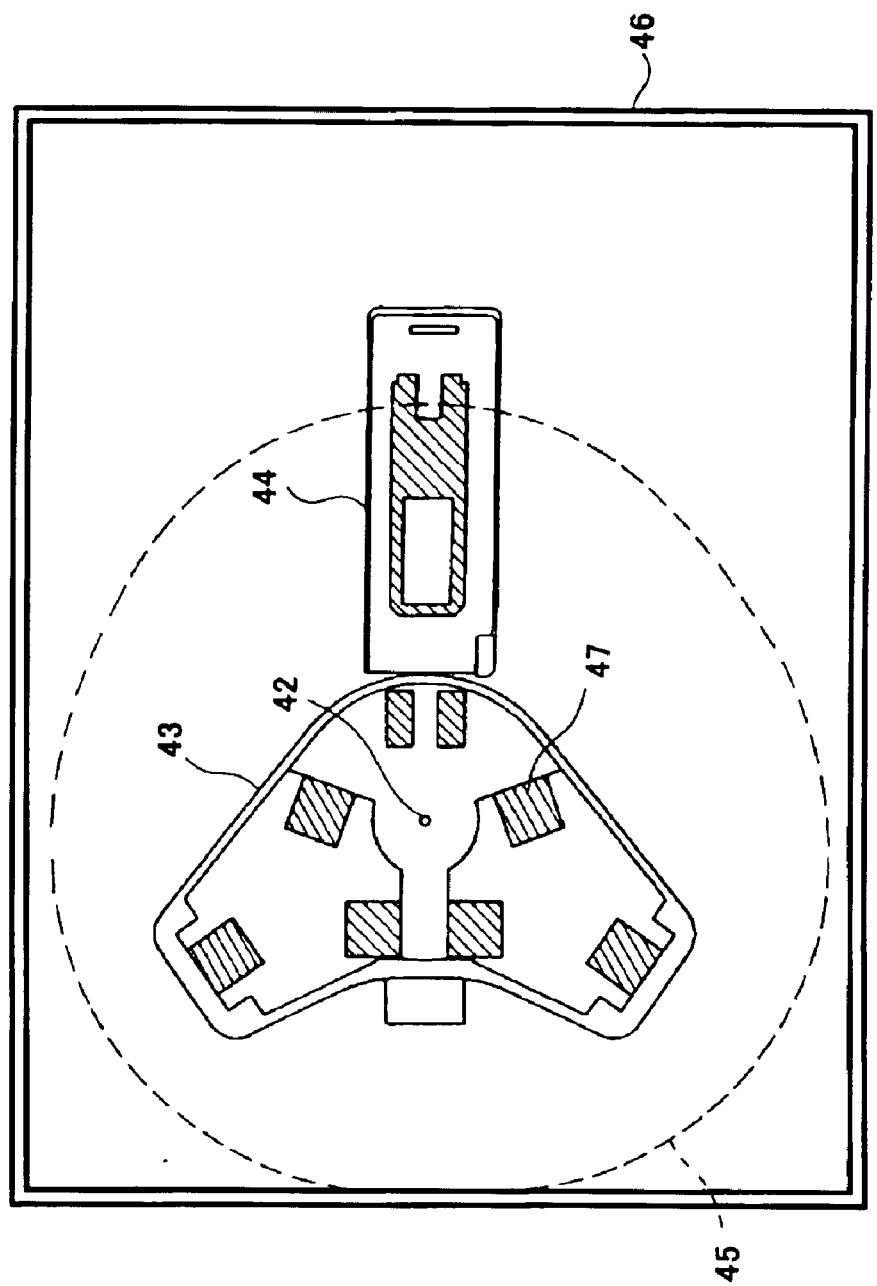
FIG. 4 is a plan view of an installation site of the MRI apparatus to which the present invention is applied.

FIG. 4 is a plan view of the examination room in which the magnetostatic field generating magnets 2 and the table 14 are installed, in which the place where the lower plate member 26 is mounted is indicated by a profile line 43, and the place where the table 14 is mounted is indicated by a profile line 44. If a dot 42 represents a projected point of the center of magnetostatic field generating magnets 2, the border 45 of a leakage flux of 5 mT, indicated by a broken line, is within the inside of the wall 46 of the examination room. Leveling of the hatched parts 47 (shown at 9 locations) is carried out as a process before the magnetostatic field generating magnets 2 and the table 14 are brought in and assembled or mounted. To be more specific, the levels of hatched parts are adjusted so as to be at the same level with respect to the floor level by applying as many steel plates 0.5 mm in thickness as necessary.

Figure 5:
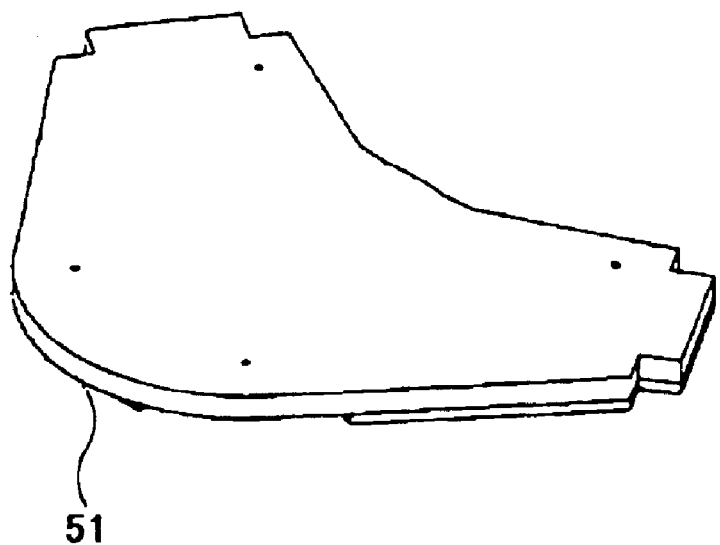
FIG. 5 shows how the lower plate is assembled.
Figure 5:
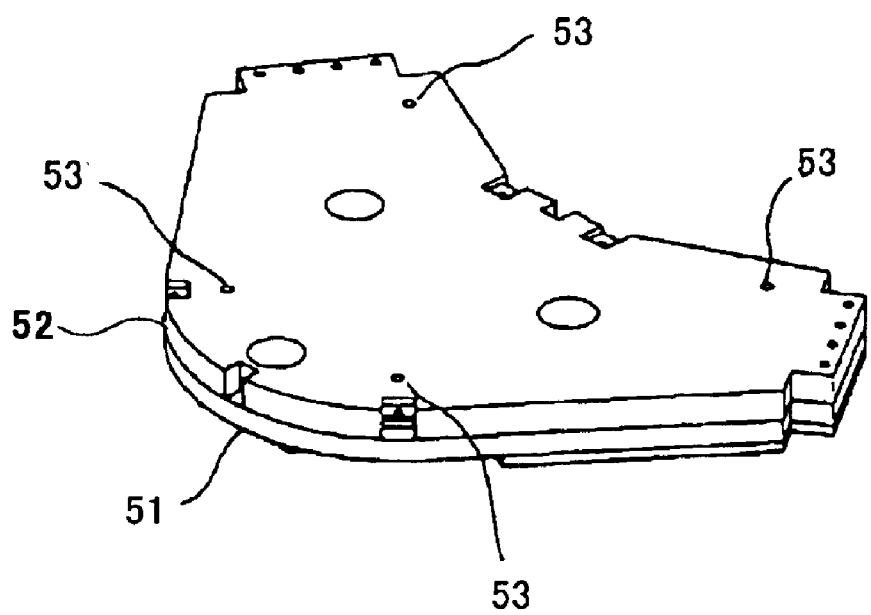

After the preparation is finished, as shown in FIG. 5, a first component plate 51 of the lower plate member 26 is placed at the installation place of the magnets. Then, a second component plate 52 of the lower plate member 26 is placed on the first component plate 51, and the second component plate 52 is fixed to the first component plate 51 by bolts 53 making sure that there is not any clearance between the first component plate 51 and the second component plate 52 due to foreign substances caught therein.

Figure 6:
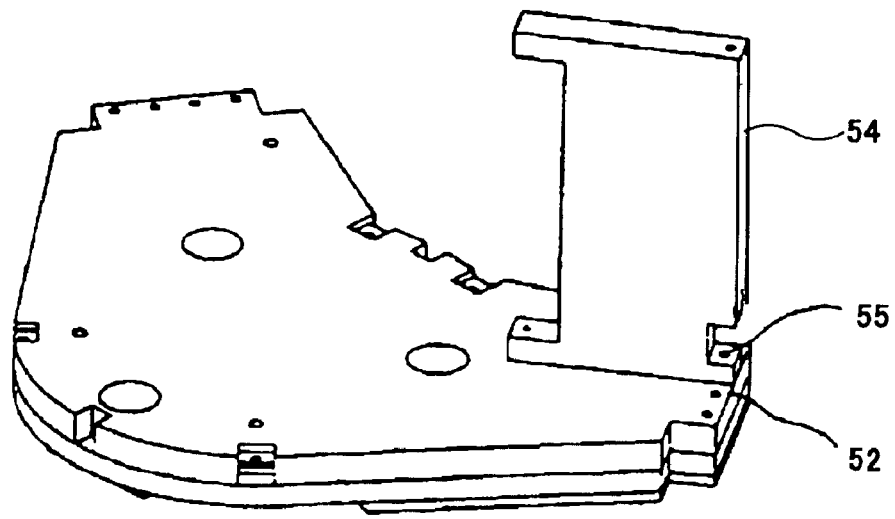
FIG. 6 shows how a left support-post segment and a right support-post segment are mounted to the lower plate.
Figure 6:
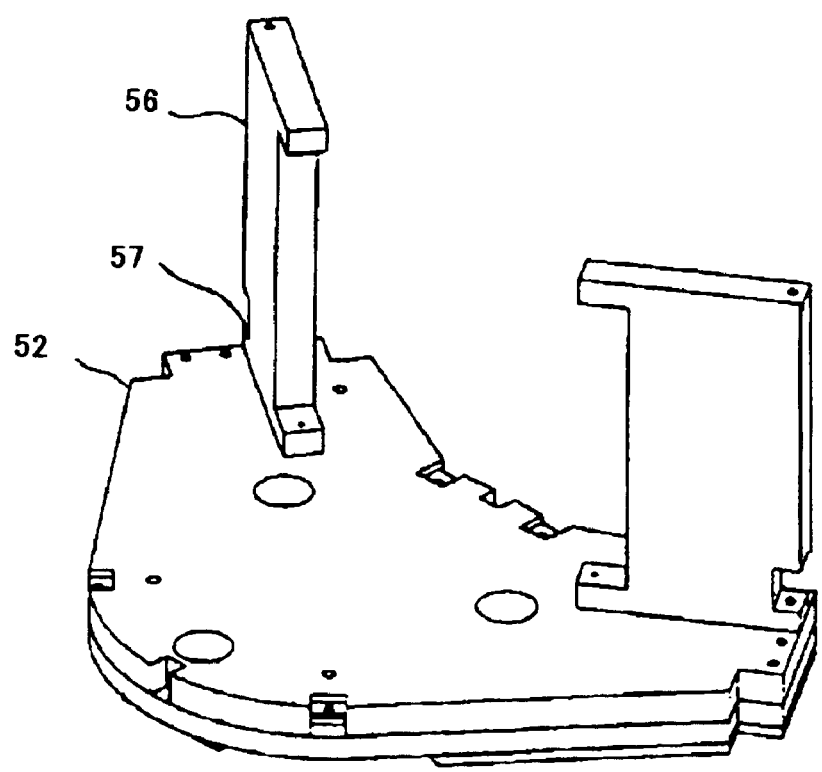
Figure 7:
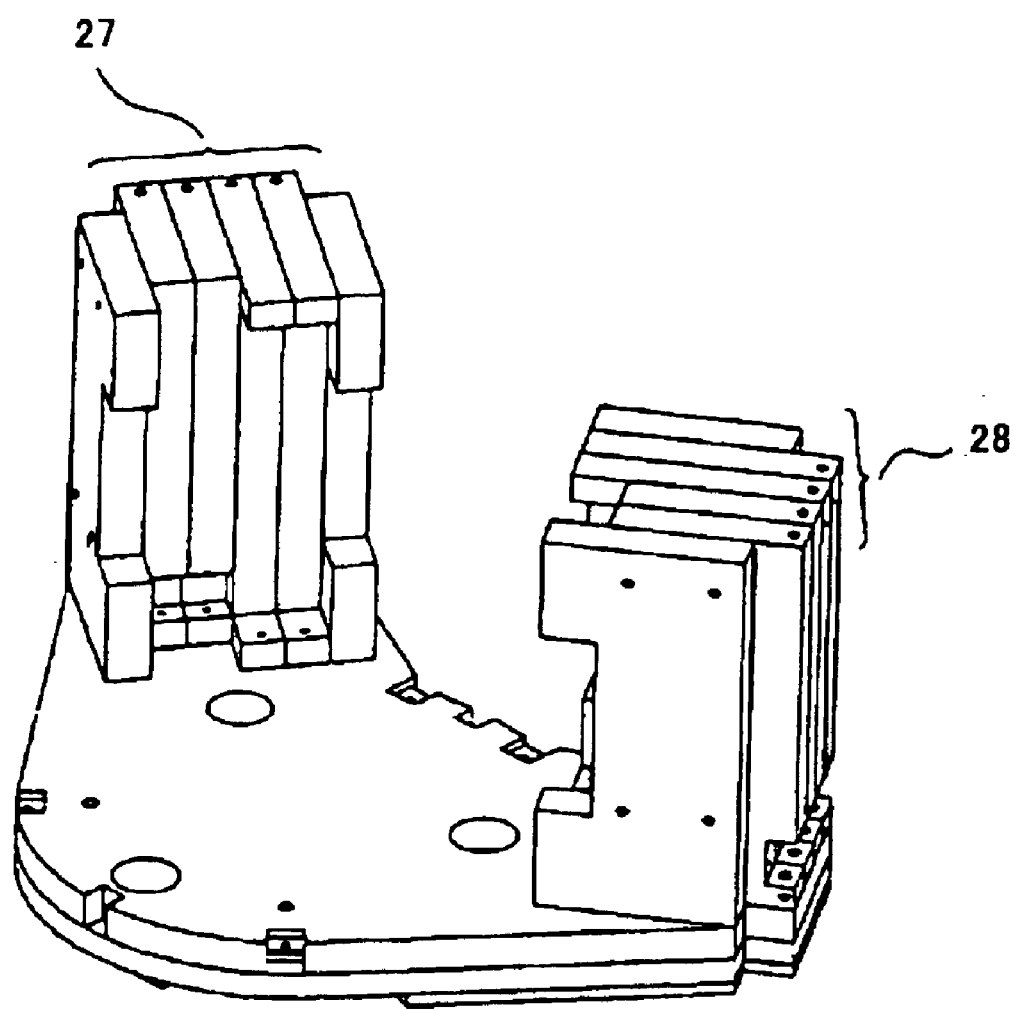
FIG. 7 shows how the left support-post segments and the right support-post segments are mounted to the lower plate.

As shown in FIG. 6, a first component plate of the right support-post member 28 is mounted to the component plate 52 of the lower plate member 26 and is fixed by bolts 55. Similarly, a first component plate 56 of the left support-post member 27 is mounted to the component plate 52 of the lower plate member 26, and is fixed by bolts 57 (at locations not shown). In the embodiment illustrated, each of the support-post members 27, 28 includes three pairs (six pieces) of plates (segments) of different shapes, and by mounting those plates one after another to the lower plate member 26, the left and right support-post members are completed (FIG. 7). Those plates (segments) are made in such shapes as to minimize the leakage fields and to have the connection pipes 24 of the cryostats 21 adapted thereto. Also when mounting those plates to the lower plate members 26, make sure that there is no clearance caused by foreign substances caught between the mating faces of the lower plate member 26 and the left and right support-post members 27, 28, which the magnetic fluxes pass through.

Figure 8:
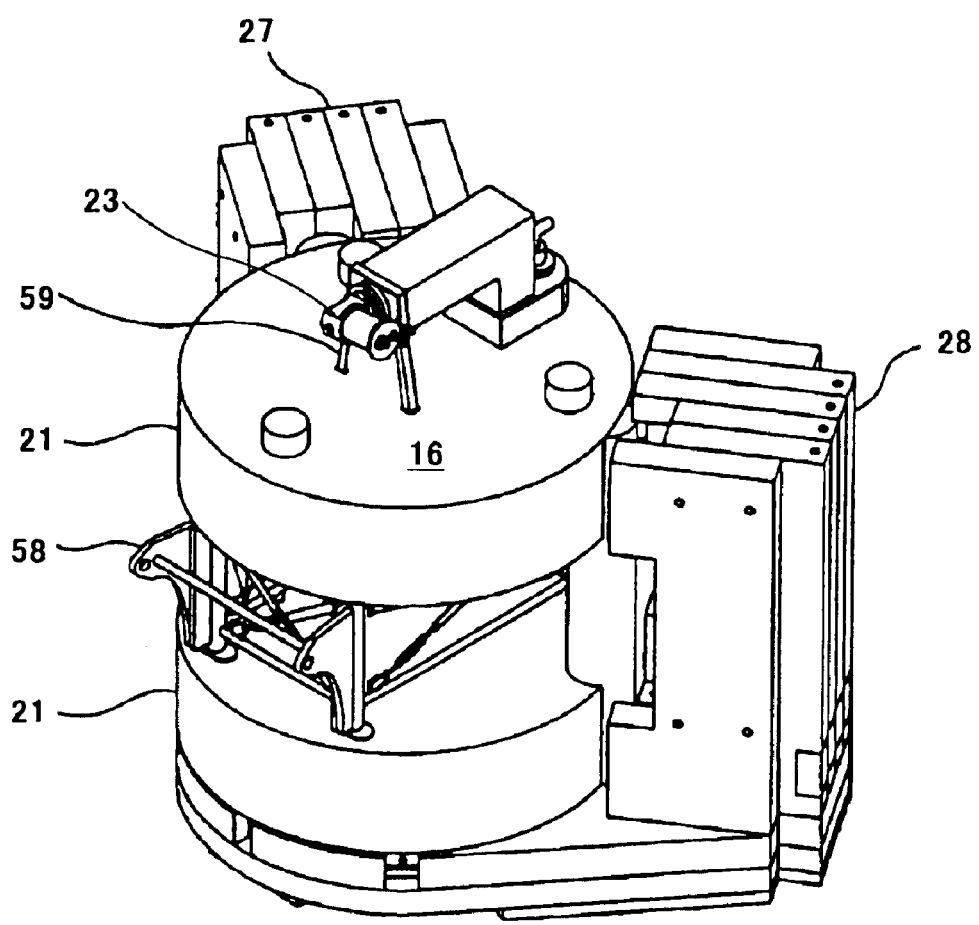
FIG. 8 shows how the superconducting magnets are mounted.

Under the condition that the left and right support-post members 27, 28 are mounted to the lower plate member 27 as mentioned above, the basic component structure using the superconducting magnets 16 shown in FIG. 3 is mounted in the space between the support-post members (FIG. 8). During this mounting work, a jig 58 that functions as a hook for lifting the superconducting magnets 21 by a hoist is mounted between the cryostats 21. This jig 58, in addition to functioning as the hook, also serves to support the weight of the upper and lower cryostats 21 in the mounting work. In the same way, a jig 59 should preferably be attached between the upper cryostat 21 and the cryo-cooler 23 to support the cryo-cooler 23 in the mounting work shown in FIG. 8. Those jigs 58 and 59 are removed after the superconducting magnets have been mounted.

Figure 9:
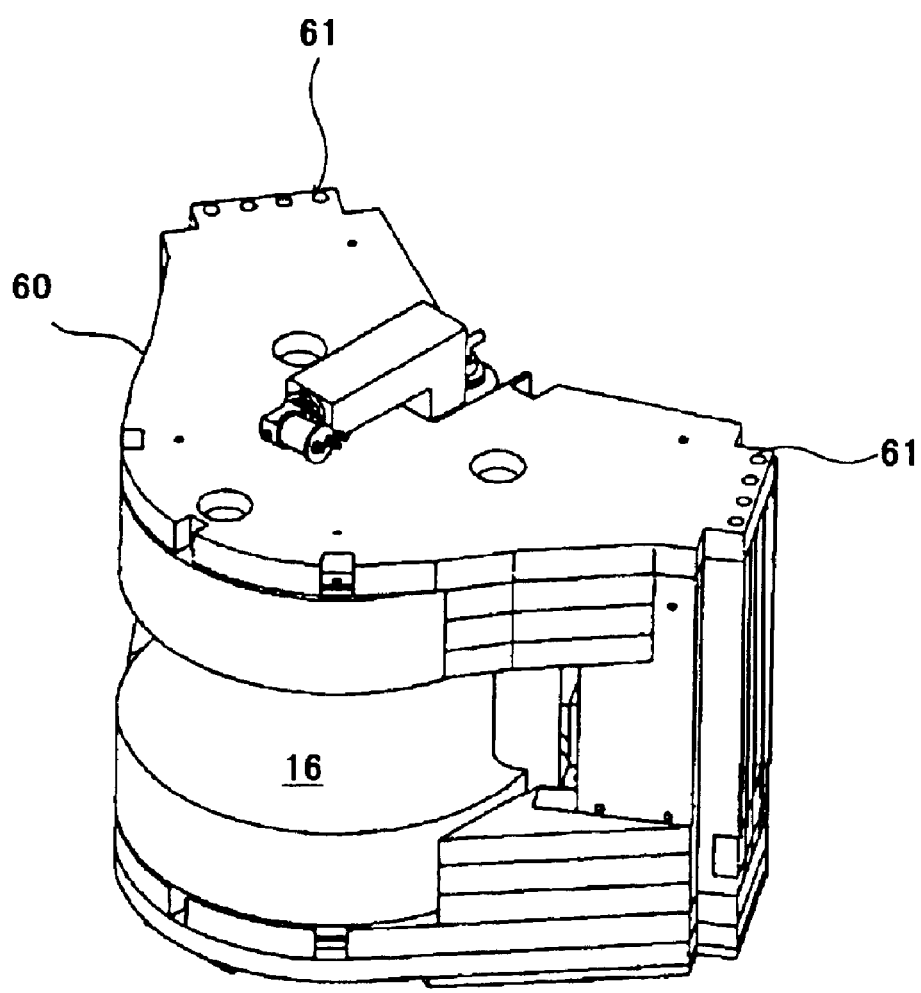
FIG. 9 shows how the upper plate is mounted.

After the superconducting magnets 16 are mounted, a first component plate 60 of the upper plate member 25 is fixed to the upper superconducting magnet 16 by bolts 61 as shown in FIG. 9. It should be confirmed as mentioned above that there is not any clearance between the mating faces of the first component plate 60 of the upper plate member 25 and the left and right support-post members 27, 28, which the magnetic fluxes pass through.

Figure 10:
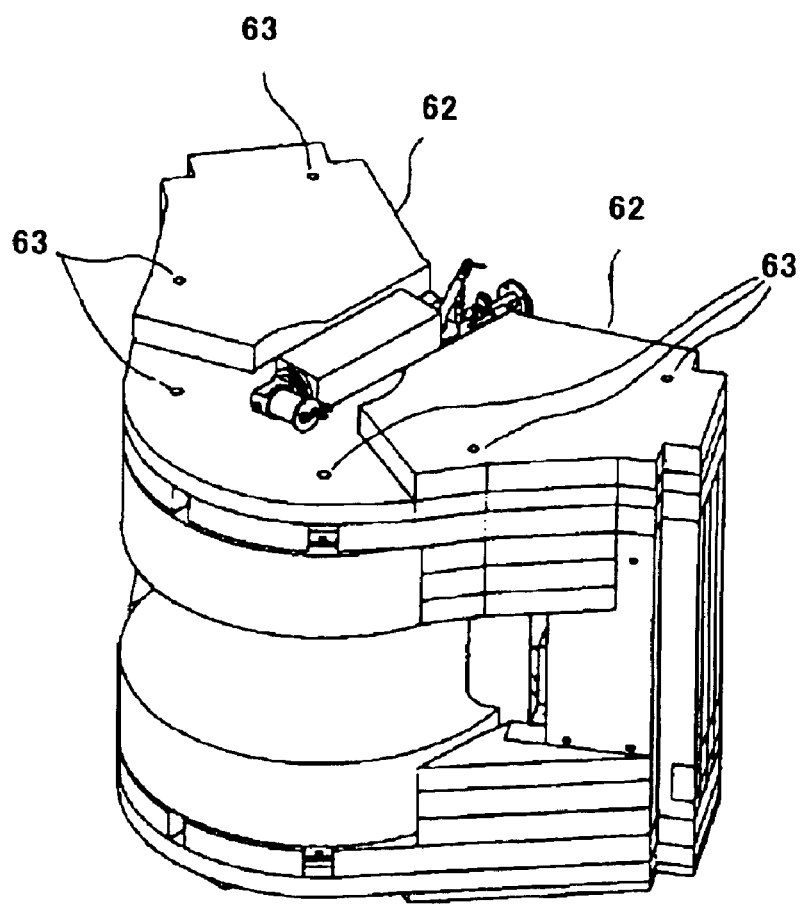
FIG. 10 shows how the upper plate is assembled.

Finally, as shown in FIG. 10, two component plates 62 of the upper plate member 25 are laid on the first plate 60 and fixed by bolts 63.

By assembling the iron yoke composed of a plurality of segments (plates) step by step, even the magnetostatic field generating magnets weighing a total of about 40 tons can be easily assembled and set up where it is installed. By designing the shapes of the segments suitably, the segments as a whole can be made in minimum shapes such as not to be saturated by magnetic flux density, the leakage flux can be reduced efficiently, and its effects on the magnetostatic field uniformity can be minimized.

Figure 11:
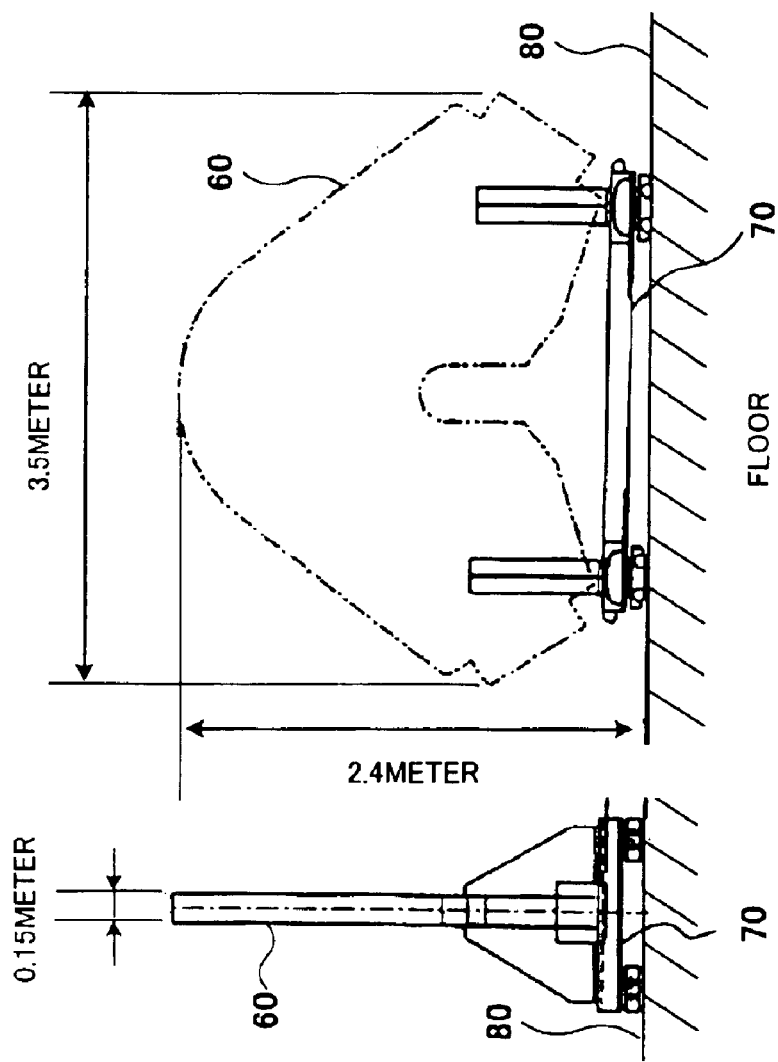
FIG. 11 shows how a plate is transferred into the site.
Figure 12:
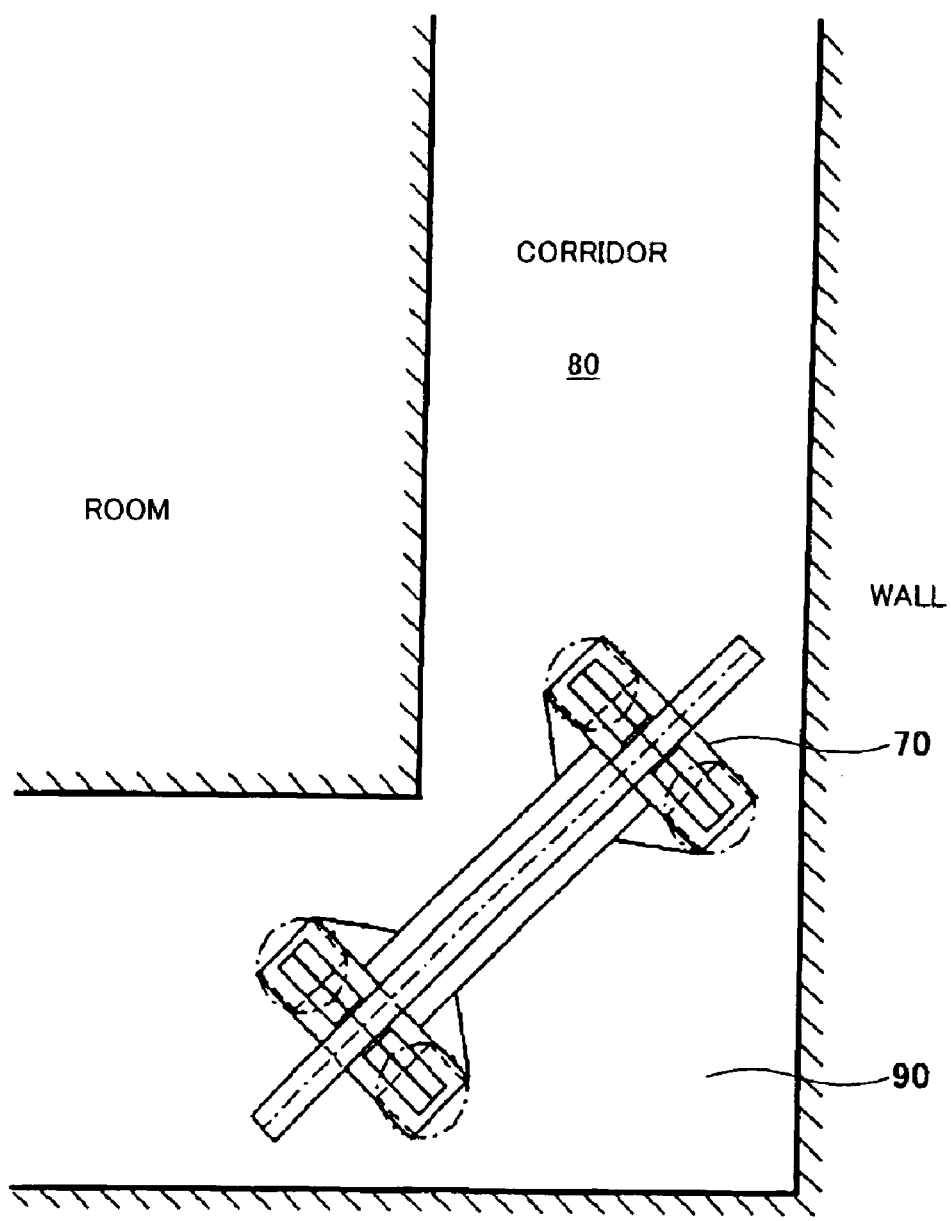
FIG. 12 shows how the plate is transferred into the site.

FIGS. 11 and 12 show, as an example, how a part of the yoke measuring 3.5 wide, 2.6 m high and 2.4 m deep is transferred into the examination room by a carriage 70. In this yoke (magnetic circuit), the upper plate member 25 and the lower plate member 26 are each split into two pieces, and the left support-post 27 and the right support-post 28 are each divided into six pieces. After division, each plate weighs not more than 10 tons, and the cut plates of the upper plate member 25 and the lower plate member 26, components largest in size, measure 3.5 m wide, 2.4 m high and 0.15 m thick. As shown in FIG. 11, such a plate can be transferred stood upright on a carriage 70 on the floor, and can easily pass through a corner 90 of the corridor in a hospital.

By transferring into the examination room and assembling cut plates one after another, masses and sizes to be transferred can be reduced greatly. During assembling, as has been described, by mounting the superconducting magnets 16 as shown in FIG. 3 and fixing the gradient field coils 3 and the RF coils 5, each in a plate form, to the cryostats 21, the MRI apparatus is completed.

In the foregoing, description has been made of the process by which the upper and lower plate members and the left and right support-post members are divided and the cut pieces are assembled, but the number of segments and the shapes of individual segments of the yoke, for example, are not limited, but may be changed as one thinks suitable according to the workability of the yoke and the condition of transport to the installation site. For example, it is possible to further subdivide the segments (plates) into smaller pieces and transport or transport assemblies of a small number of segments. For example, by transporting a single structure combining the left and right support-posts, assembling man-hours can be reduced.

According to the present invention, the leakage field strength of an MRI apparatus using magnets for generating strong fields in an open structure in a smallest-possible space. According to the present invention, in an MRI apparatus using magnets for generating high fields, it is possible to adopt an optimum three-dimensional iron shield structure for keeping the field uniformity of the examination room at a high level. Further, according to the present invention, it is possible to carry out assembling, maintaining and inspecting operations of the MRI apparatus including magnetic devices large in weight and size.

What is claimed is:

1. Magnetic resonance imaging apparatus comprising:
   a pair of a first magnet device and a second magnet device for generating a magnetostatic field, said pair of magnet devices being installed in face-to-face relation with each other across an examination space for accommodating an examinee;
   a gradient-field generating device;
   a high-frequency field generating device; and
   a yoke for combining said first and second magnetic devices to guide magnetic fluxes generated by said first and second magnetic devices to thereby form a closed magnetic circuit, wherein said yoke includes a first plate member fixed to a first magnet device, a second plate member fixed to a second magnet device and one or more support-post members interconnecting said first plate member and said second plate member, each of said first and second plate members and support-post members includes a plurality of segments formed in such a shape as to minimize leakage field strength from said first magnet device and said second magnet device.

2. Magnetic resonance imaging apparatus according to claim 1, wherein each of said first and second plate members and said support-post members includes a plurality of segments of different shapes and said segments are combined in a pattern to match lines of magnetic induction generated by said first and second magnetic devices.

3. Magnetic resonance imaging apparatus according to claim 2, wherein said first and second plate members have different numbers of segments at different positions based on a calculated magnetic flux distribution in said yoke, and said first and second plate members have segments of shapes to match a calculated magnetic flux distribution.

4. Magnetic resonance imaging apparatus according to claim 1, wherein said first and second magnet devices are superconducting magnet devices, and said superconducting magnet devices each include a cryostat unit containing a superconducting coil to cool said superconducting coil, said cryostat units are mounted between said plurality of segments.

5. Magnetic resonance imaging apparatus according to claim 1, wherein said support-post members each include two support posts for connecting said first and second plate members at separate positions, and said two support posts are each formed by a combination of a plurality of segments.

6. Magnetic resonance imaging apparatus according to claim 5, wherein said cryostat unit has mounted therein a part for achieving a desired field uniformity in said examination space.

7. Magnetic resonance imaging apparatus according to claim 1, wherein said shape to minimize said leakage field strength from said first and second magnet devices is a shape to match lines of magnetic induction generated by said first and second magnetic devices.

8. Magnetic resonance imaging apparatus according to claim 1, wherein each of said first and second plate members and said support-post members includes a plurality of segments of different shapes and said segments are combined in a pattern to match lines of magnetic induction generated by said first and second magnetic devices, said shape to minimize said leakage field strength from said first and second magnet devices is shape to match lines of magnetic induction generated by said first and second magnetic devices, and said shape to minimize said leakage field strength from said first and second magnet devices is a shape formed by varying a thickness of said segments according to a flux density of said leakage field generated by said first and second magnet devices.

9. Magnetic resonance imaging apparatus according to claim 1, wherein at least some of the plurality of segments are subdivided into smaller pieces forming a respective segment; and
   each of said first and second plate members and support-post members is assembled from the plurality of segments including the smaller pieces thereof.

10. Magnetic resonance imaging apparatus comprising:
    a pair of a first magnet device and a second magnet device for generating a magnetostatic field, said pair of magnet devices being installed in face-to-face relation with each other across an examination space for accommodating an examinee;
    a gradient-field generating device;
    a high-frequency field generating device; and
    a yoke for combining said first and second magnetic devices to guide magnetic fluxes generated by said first and second magnetic devices to thereby form a closed magnetic circuit, wherein said yoke includes a first plate member fixed to a first magnet device, a second plate member fixed to a second magnet device and one or more support-post members interconnecting said first plate member and said second plate member, each of said first and second plate members and support-post members includes a plurality of segments formed in such a shape as to minimize leakage field strength from said first magnet device and said second magnet device;
    wherein each of said first and second plate members and said support-post members includes a plurality of segments of different shapes and said segments are combined in a pattern to match lines of magnetic induction generated by said first and second magnetic devices; and
    wherein said first and second plate members are formed by a larger number of segments at positions thereon where said first and second plate members are connected to said support-post members and also in vicinities of said positions than at the other positions.

11. Magnetic resonance imaging apparatus according to claim 10, wherein at least some of the plurality of segments are subdivided into smaller pieces forming a respective segment; and
    each of said first and second plate members and support-post members is assembled from the plurality of segments including the smaller pieces thereof.

12. Magnetic resonance imaging apparatus comprising:
    a pair of a first magnet device and a second magnet device for generating a magnetostatic field, said pair of magnet devices being installed in face-to-face relation with each other across an examination space for accommodating an examinee;
    a gradient-field generating device;
    a high-frequency field generating device; and a yoke for combining said first and second magnetic devices to guide magnetic fluxes generated by said first and second magnetic devices to thereby form a closed magnetic circuit, wherein said yoke includes a first plate member fixed to a first magnet device, a second plate member fixed to a second magnet device and one or more support-post members interconnecting said first plate member and said second plate member, each of said first and second plate members and support-post members includes a plurality of segments formed in such a shape as to minimize leakage field strength from said first magnet device and said second magnet device;

wherein each of said first and second plate members and said support-post members includes a plurality of segments of different shapes and said segments are combined in a pattern to match lines of magnetic induction generated by said first and second magnetic devices; and wherein said first and second plate members have different numbers of segments at different positions based on a calculated magnetic flux distribution in said yoke.

13. Magnetic resonance imaging apparatus according to claim 12, wherein at least some of the plurality of segments are subdivided into smaller pieces forming a respective segment; and each of said first and second plate members and support-post members is assembled from the plurality of segments including the smaller pieces thereof.

14. Magnetic resonance imaging apparatus comprising:

a pair of a first magnet device and a second magnet device for generating a magnetostatic field, said pair of magnet devices being installed in face-to-face relation with each other across an examination space for accommodating an examinee;

a gradient-field generating device;

a high-frequency field generating device; and a yoke for combining said first and second magnetic devices to guide magnetic fluxes generated by said first and second magnetic devices to thereby form a closed magnetic circuit, wherein said yoke includes a first plate member fixed to a first magnet device, a second plate member fixed to a second magnet device and one or more support-post members interconnecting said first plate member and said second plate member, each of said first and second plate members and support-post members includes a plurality of segments formed in such a shape as to minimize leakage field strength from said first magnet device and said second magnet device;

wherein each of said first and second plate members and said support-post members includes a plurality of segments of different shapes and said segments are combined in a pattern to match lines of magnetic induction generated by said first and second magnetic devices; and wherein said first and second plate members have segments of shapes to match a calculated magnetic flux distribution.

15. Magnetic resonance imaging apparatus according to claim 14, wherein at least some of the plurality of segments are subdivided into smaller pieces forming a respective segment; and each of said first and second plate members and support-post members is assembled from the plurality of segments including the smaller pieces thereof.

16. Magnetic resonance imaging apparatus comprising:

a pair of a first magnet device and a second magnet device for generating a magnetostatic field, said pair of magnet devices being installed in face-to-face relation with each other across an examination space for accommodating an examinee;

a gradient-field generating device;

a high-frequency field generating device; and a yoke for combining said first and second magnetic devices to guide magnetic fluxes generated by said first and second magnetic devices to thereby form a closed magnetic circuit, wherein said yoke includes a first plate member fixed to a first magnet device, a second plate member fixed to a second magnet device and one or more support-post members interconnecting said first plate member and said second plate member, each of said first and second plate members and support-post members includes a plurality of segments formed in such a shape as to minimize leakage field strength from said first magnet device and said second magnet device;

wherein said first and second plate members and said support-post members are constructed by stacking in two or more layers segments formed by cutting steel plate.

17. Magnetic resonance imaging apparatus according to claim 16, wherein at least some of the plurality of segments are subdivided into smaller pieces forming a respective segment; and each of said first and second plate members and support-post members is assembled from the plurality of segments including the smaller pieces thereof.

18. Magnetic resonance imaging apparatus comprising:

a pair of a first magnet device and a second magnet device for generating a magnetostatic field, said pair of magnet devices being installed in face-to-face relation with each other across an examination space for accommodating an examinee;

a gradient-field generating device;

a high-frequency field generating device; and a yoke for combining said first and second magnetic devices to guide magnetic fluxes generated by said first and second magnetic devices to thereby form a closed magnetic circuit, wherein said yoke includes a first plate member fixed to a first magnet device, a second plate member fixed to a second magnet device and one or more support-post members interconnecting said first plate member and said second plate member, each of said first and second plate members and support-post members includes a plurality of segments formed in such a shape as to minimize leakage field strength from said first magnet device and said second magnet device;

wherein said shape to minimize said leakage field strength from said first and second magnet devices is a shape formed by varying a thickness of said segments according to a flux density of said leakage field generated by said first and second magnet devices.

19. Magnetic resonance imaging apparatus according to claim 18, wherein at least some of the plurality of segments are subdivided into, smaller pieces forming a respective segment; and each of said first and second plate members and support-post members is assembled from the plurality of segments including the smaller pieces thereof.

20. Magnetic resonance imaging apparatus comprising:

a pair of a first magnet device and a second magnet device for generating a magnetostatic field, said pair of magnet devices being installed in face-to-face relation with each other across an examination space for accommodating an examinee;

a gradient-field generating device;

a high-frequency field generating device; and a yoke for combining said first and second magnetic devices to guide magnetic fluxes generated by said first and second magnetic devices to thereby form a closed magnetic circuit, wherein said yoke includes a first plate member fixed to a first magnet device, a second plate member fixed to a second magnet device and one or more support-post members interconnecting said first plate member and said second plate member, each of said first and second plate members and support-post members includes a plurality of segments.

21. Magnetic resonance imaging apparatus according to claim 20, wherein each of said first and second plate members and said support-post members includes a plurality of segments of different shapes.

22. Magnetic resonance imaging apparatus according to claim 20, wherein said first and second plate members and said support-post members are constructed by stacking in two or more layer segments.

23. Magnetic resonance imaging apparatus according to claim 20, wherein at least some of the plurality of segments are subdivided into smaller pieces forming a respective segment; and each of said first and second plate members and support-post members is assembled from the plurality of segments including the smaller pieces thereof.

* * * * *